United States Patent
Sakai et al.

(10) Patent No.: US 10,132,631 B2
(45) Date of Patent: Nov. 20, 2018

(54) ANGULAR VELOCITY SENSOR

(71) Applicant: DENSO CORPORATION, Kariya, Aichi-pref. (JP)

(72) Inventors: Minekazu Sakai, Kariya (JP); Naoki Yoshida, Kariya (JP); Kiyomasa Sugimoto, Kariya (JP)

(73) Assignee: DENSO CORPORATION, Kariya (JP)

(*) Notice: Subject to any disclaimer, the term of this patent is extended or adjusted under 35 U.S.C. 154(b) by 186 days.

(21) Appl. No.: 15/123,756

(22) PCT Filed: Apr. 17, 2015

(86) PCT No.: PCT/JP2015/002118
§ 371 (c)(1),
(2) Date: Sep. 6, 2016

(87) PCT Pub. No.: WO2015/162888
PCT Pub. Date: Oct. 29, 2015

(65) Prior Publication Data
US 2017/0016724 A1    Jan. 19, 2017

(30) Foreign Application Priority Data
Apr. 23, 2014    (JP) ................ 2014-089319

(51) Int. Cl.
*G01C 19/5607*    (2012.01)
*G01C 19/5614*    (2012.01)
(Continued)

(52) U.S. Cl.
CPC ..... *G01C 19/5614* (2013.01); *G01C 19/5607* (2013.01); *G01C 19/5621* (2013.01);
(Continued)

(58) Field of Classification Search
CPC ............ G01C 19/5607; G01C 19/5614; G01C 19/5628; G01C 19/5642; G01C 19/5649;
(Continued)

(56) References Cited

U.S. PATENT DOCUMENTS 5,969,225 A    10/1999    Kobayashi
6,257,058 B1 *    7/2001    Murata ............. G01C 19/5607
                                          310/370

(Continued)

FOREIGN PATENT DOCUMENTS

JP    2000-121365 A    4/2000
JP    3512004 B2    3/2004
(Continued)

*Primary Examiner* — Helen C Kwok
(74) *Attorney, Agent, or Firm* — Posz Law Group, PLC (57) ABSTRACT

An angular velocity sensor includes a first substrate having first and second surfaces, a vibrating member disposed on the first substrate and including a drive piece capable of vibrating along the first substrate, a second substrate disposed on the first surface side, a first drive piece control electrode, a first drive piece auxiliary electrode, and a first drive piece control circuit applying a voltage to the first drive piece auxiliary electrode. The first drive piece control circuit adjusts, based on the capacitance generated between the first drive piece control electrode and the first drive piece auxiliary electrode, the voltage to be applied to the first drive piece auxiliary electrode to maintain a constant distance between the first drive piece control electrode and the first drive piece auxiliary electrode.

5 Claims, 9 Drawing Sheets (51) Int. Cl.
*G01C 19/5621* (2012.01)
*G01C 19/5628* (2012.01)
*G01C 19/5642* (2012.01)
*H01L 41/047* (2006.01)
*H03H 9/21* (2006.01)
*H01L 41/04* (2006.01)
*H01L 41/113* (2006.01)

(52) U.S. Cl.
CPC ..... *G01C 19/5628* (2013.01); *G01C 19/5642* (2013.01); *H01L 41/042* (2013.01); *H01L 41/047* (2013.01); *H01L 41/1132* (2013.01); *H03H 9/21* (2013.01)

(58) Field of Classification Search
CPC ............ G01C 19/5656; G01C 19/5663; G01C 19/5719; G01C 19/5621
See application file for complete search history.

(56) References Cited

U.S. PATENT DOCUMENTS

| | | | | |
|---|---|---|---|---|
| 6,388,300 | B1 * | 5/2002 | Kano | B81B 3/0086 257/417 |
| 6,439,052 | B1 * | 8/2002 | Abe | G01C 19/5607 73/504.16 |
| 6,470,748 | B1 * | 10/2002 | Geen | G01C 19/5719 73/504.12 |
| 7,434,466 | B2 * | 10/2008 | Ito | G01C 19/56 73/503.3 |
| 7,444,868 | B2 * | 11/2008 | Johnson | G01C 19/5719 73/504.12 |
| 8,094,841 | B2 * | 1/2012 | Trusov | G01C 19/5719 381/174 |
| 9,574,879 | B2 * | 2/2017 | Chaumet | G01C 19/5747 |
| 9,726,491 | B2 * | 8/2017 | Stewart | G01C 19/5705 |
| 2001/0047687 | A1 * | 12/2001 | Abe | G01C 19/5607 73/504.16 |
| 2002/0051258 | A1 | 5/2002 | Tamura | |
| 2003/0159510 | A1 * | 8/2003 | Stewart | G01C 19/5705 73/504.12 |
| 2006/0027019 | A1 * | 2/2006 | Ito | G01C 19/5719 73/504.12 |
| 2009/0039739 | A1 | 2/2009 | Tochi et al. | |
| 2010/0116052 | A1 * | 5/2010 | Yanagisawa | G01C 19/5607 73/504.16 |

FOREIGN PATENT DOCUMENTS

| | | |
|---|---|---|
| JP | 2006-010659 A | 1/2006 |
| JP | 2009-294127 A | 12/2009 |
| JP | 2013-005072 A | 1/2013 |
| JP | 2014-002110 A | 1/2014 |

* cited by examiner

FIG. 11

ANGULAR VELOCITY SENSOR

CROSS REFERENCE TO RELATED APPLICATIONS

This application is a U.S. national stage application of International Patent Application No. PCT/JP2015/02118 filed on Apr. 17, 2015 and is based on Japanese Patent Application No. 2014-089319 filed on Apr. 23, 2014, the disclosure of which is incorporated herein by reference.

TECHNICAL FIELD

The present disclosure relates to an angular velocity sensor including a vibrating member.

BACKGROUND

Up to now, as an angular velocity sensor including a vibrating member, an angular velocity sensor in which the vibrating member includes first and second drive pieces and a detection piece has been proposed (for example, refer to Patent Literature 1). In this kind of angular velocity sensor, the first and second drive pieces and the detection piece are fixed to a base portion.

Specifically, the vibrating member of the angular velocity sensor is of a so-called tripod tuning fork type which is formed by etching a substrate made of a piezoelectric material. Further, the vibrating member has the first and second drive pieces and the detection piece, and the first and second drive pieces and the detection piece are projected from the base portion in the same direction.

The detection piece is disposed between the first and second drive pieces. Each of the first and second drive pieces and the detection piece has a rectangular cross-sectional shape having side surfaces perpendicular to an array direction of the first and second drive pieces and the detection piece, and a front surface and a rear surface perpendicular to the side surfaces (in parallel to a plane direction of the substrate).

In the above-described angular velocity sensor, when pulsed drive signals different in phase by 180° are supplied to the respective first and second drive pieces, the first and second drive pieces vibrate in the array direction of the first and second drive pieces and the detection piece, and the detection piece maintains a substantially stationary state. When an angular velocity is applied in this state, a pair of Coriolis forces whose directions are opposite to each other along a projecting direction are generated in the first and second drive pieces, and moments generated by the Coriolis forces are transmitted to the detection piece through the base portion. As a result, the detection piece vibrates (is bent) according to the angular velocity, and the angular velocity is detected on the basis of charge generated on the detection piece.

In the above-described angular velocity sensor, although the cross-section surface of each of the first and second drive pieces has the rectangular shape, it is difficult to make the side surfaces completely perpendicular to the front surface and the rear surface at respective connection portions, and the connection portions are slightly rounded (have tapered shapes). For this reason, when the first and second drive pieces are vibrated, the first and second drive pieces may be displaced (unnecessarily vibrated) in a normal direction (a direction perpendicular to a vibration direction) to the plane direction of the substrate. When the first and second drive pieces are displaced in the normal direction, the moments caused by the displacement are transmitted to the detection piece, thereby adversely affecting a detection precision.

Patent Literature

Patent Literature 1: JP 2006-10659 A

SUMMARY

In view of the foregoing difficulties, it is an object of the present disclosure to provide an angular velocity sensor capable of suppressing a reduction in detection precision.

According to an aspect of the present disclosure, an angular velocity sensor includes a first substrate including a first surface and a second surface, which is disposed opposite to the first surface, a vibrating member disposed on the first substrate and including a drive piece, a second substrate disposed on a side of the first surface of the first substrate, a first drive piece control electrode disposed on a portion of the drive piece close to the second substrate, a first drive piece auxiliary electrode disposed on a portion of the second substrate facing a displaceable region of the drive piece, and a first drive piece control circuit applying a voltage to the first drive piece auxiliary electrode. The drive piece is capable of vibrating in a plane direction of the first substrate, and the vibrating member detects an angular velocity applied to a plane of the first substrate during a vibration of the drive piece. A capacitance is generated between the first drive piece auxiliary electrode and the first drive piece control electrode. The first drive piece control circuit adjusts, based on the capacitance generated between the first drive piece control electrode and the first drive piece auxiliary electrode, the voltage to be applied to the first drive piece auxiliary electrode so that a distance between the first drive piece control electrode and the first drive piece auxiliary electrode is maintained to be constant.

In the above angular velocity sensor, the voltage to be applied to the first drive piece auxiliary electrode is adjusted to keep the constant distance between the first drive piece control electrode and the first drive piece auxiliary electrode. In other words, an electrostatic force between the first drive piece control electrode and the first drive piece auxiliary electrode is adjusted to keep the constant distance between the first drive piece control electrode and the first drive piece auxiliary electrode. For that reason, the drive piece can be suppressed from being displaced in the normal direction of the plane direction of the first substrate, and the detection precision can be suppressed from being degraded.

BRIEF DESCRIPTION OF DRAWINGS

The above and other objects, features and advantages of the present invention will become more apparent from the following detailed description made with reference to the accompanying drawings. In the drawings.

DETAILED DESCRIPTION

Embodiments of the present disclosure will be described below with reference to the accompanying drawings. In the following respective embodiments, parts identical with or equivalent to each other are denoted by the same reference symbols for description.

First Embodiment

A first embodiment of the present disclosure will be described with reference to the drawings. An angular velocity sensor according to the present embodiment includes a sensor unit and a circuit unit, and a configuration of the sensor unit will be first described.

Figure 1:
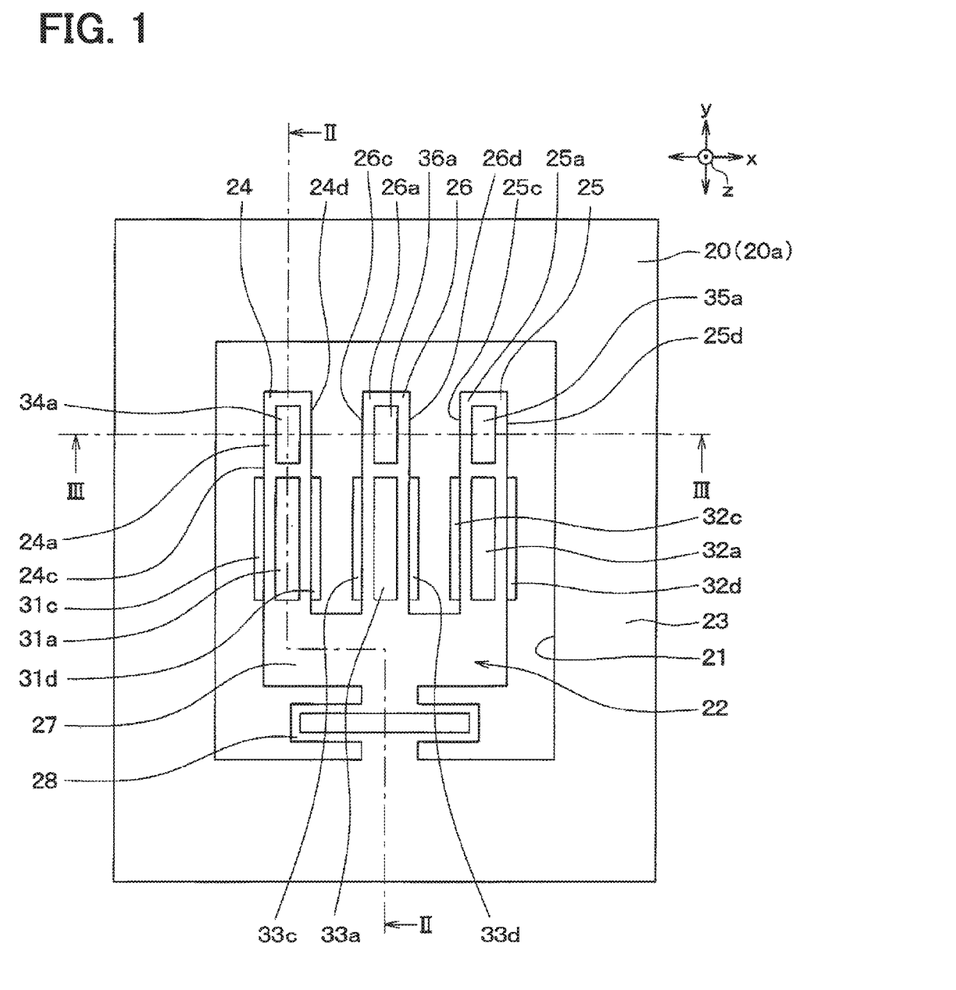
FIG. 1 is a diagram showing a top view of a first substrate in a sensor unit.
Figure 2:
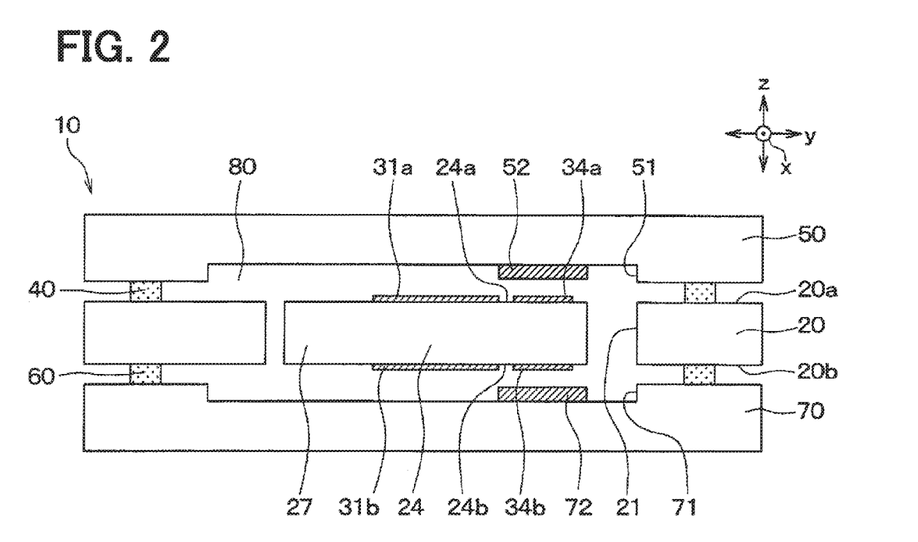
FIG. 2 is a diagram showing a cross-sectional view of the sensor unit taken along a line II-II in FIG. 1.
Figure 3:
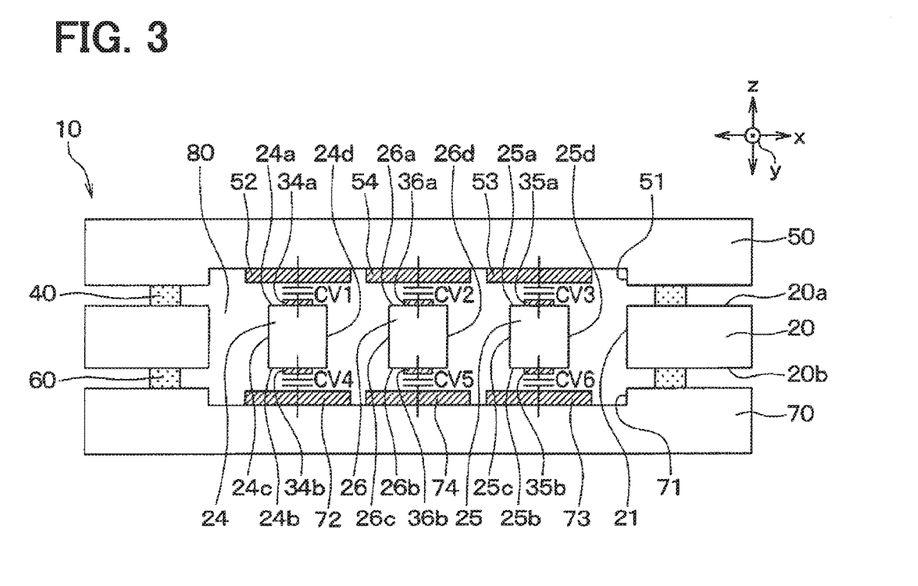
FIG. 3 is a diagram showing cross-sectional view of the sensor unit taken along a line III-III in FIG. 1.

As illustrated in FIGS. 1 to 3, a sensor unit 10 includes a first substrate 20 having one surface 20a and another surface 20b opposite to the one surface 20a. The one surface 20a is also referred to as "first surface", and the other surface 20b is also referred to as "second surface". The first substrate 20 is made of piezoelectric material such as quartz or PZT (lead zirconate titanate). The first substrate 20 is subjected to well-known micro-machining to provide a groove portion 21. A vibrating member 22 is separated from an outer peripheral portion 23 by the groove portion 21.

The vibrating member 22 is configured in such a manner that first and second drive pieces 24 and 25, and a detection piece 26 are held by a base portion 27, and the base portion 27 is fixed to the outer peripheral portion 23 through a beam portion 28. In more detail, the vibrating member 22 is a tripod tuning fork type in which the first and second drive pieces 24, 25, and the detection piece 26 are projected from the base portion 27 in the same direction, and the detection piece 26 is disposed between the first and second drive pieces 24 and 25. Each of the first and second drive pieces 24 and 25, and the detection piece 26 has a longitudinal shape and the cross-section of each of the first and second drive pieces 24 and 25, and the detection piece 26 has a rectangular shape. The first drive piece 24, the second drive piece 25, and the detection piece 26 have front surfaces 24a, 25a, and 26a which are in parallel to the one surface 20a of the substrate, rear surfaces 24b, 25b, and 26b which are in parallel to the other surface 20b of the substrate, and side surfaces 24c, 24d, 25c, 25d, 26c, and 26d which connect the front surfaces 24a, 25a, and 26a with the rear surfaces 24b, 25b, and 26b, respectively.

The beam portion 28 reduces a stress generated in the outer peripheral portion 23, and suppresses the stress from being transmitted to the vibrating member 22. Alternatively, the beam portion 28 may not be provided. In other words, the base portion 27 may be directly coupled to the outer peripheral portion 23. Each of the first and second drive pieces 24 and 25, and the detection piece 26 has the rectangular-shaped cross-section. However, strictly, connection portions of the front surfaces 24a, 25a, and 26a with the side surfaces 24c, 24d, 25c, 25d, 26c, and 26d are slightly rounded (have tapered shapes), and similarly, connection portions of the rear surfaces 24b, 25b, 26b with the side surfaces 24c, 24d, 25c, 25d, 26c, and 26d are slightly rounded (have tapered shapes).

Respective directions of an x-axis direction, a y-axis direction, and a z-axis direction in FIGS. 1 to 3 will be described. In FIGS. 1 to 3, the x-axis direction is a direction (a lateral direction along a surface of the drawing sheet FIG. 1) along which the first and second drive pieces 24 and 25, and the detection piece 26 are arrayed. The y-axis direction is a direction (a longitudinal direction along the surface of the drawing sheet FIG. 1) perpendicular to the x-axis in a plane of the first substrate 20. The z-axis direction is a normal direction (a depth direction with respect to the surface of the drawing sheet FIG. 1) to a plane direction of the first substrate 20. A +z direction which will be described later is a direction directed from the first substrate 20 toward a second substrate 50, and a −z direction is a direction directed from the first substrate 20 toward a third substrate 70. The plane direction of the first substrate 20 is a direction along the plane of the first substrate 20.

As illustrated in FIGS. 1 and 2, in the first drive piece 24, a drive electrode 31a is disposed on the front surface 24a close to the base portion 27 and a drive electrode 31b is disposed on the rear surface 24b close to the base portion 27. Further, in the first drive piece 24, common electrodes 31c and 31d are, respectively, disposed on the side surfaces 24c and 24d close to the base portion 27. Likewise, as illustrated in FIG. 1, in the second drive piece 25, a drive electrode 32a is disposed on the front surface 25a close to the base portion 27, and common electrodes 32c and 32d are, respectively, disposed on the side surfaces 25c and 25d close to the base portion 27. In the second drive piece 25, a drive electrode 32b is disposed on the rear surface 25b close to the base portion 27 (refer to FIG. 4). In the detection piece 26, a detection electrode 33a is disposed on the front surface 26a close to the base portion 27, and common electrodes 33c and 33d are, respectively, disposed on the side surfaces 26c and 26d close to the base portion 27. In the detection piece 26, a detection electrode 33b is disposed on the rear surface 26b close to the base portion 27 (refer to FIG. 4).

As illustrated in FIGS. 1 and 3, in the first drive piece 24, a control electrode 34a is disposed on the front surface 24a and a control electrode 34b is disposed on the rear surface 24b at a predetermined portion (a portion close to a leading end of the first drive piece in a projecting direction) of the first drive piece 24. The predetermined portion is opposite to the base portion 27. Likewise, in the second drive piece 25, a control electrode 35a is disposed on the front surface 25a and a control electrode 35b is disposed on the rear surface 25b at a predetermined portion (a portion close to a leading end of the second drive piece in the projecting direction) of the second drive piece 25. The predetermined portion is opposite to the base portion 27. In the detection piece 26, a control electrode 36a is disposed on the front surface 26a and a control electrode 36b is disposed on the rear surface 26b at a predetermined portion (a portion close to a leading end of the detection piece in the projecting direction) of the detection piece 26. The predetermined portion is opposite to the base portion 27.

As illustrated in FIG. 3, the second substrate 50 is joined to the one surface 20a of the first substrate 20 through a joint member 40 made of an oxide film, a low dielectric glass, or metal. The second substrate 50 is provided by, for example, a silicon substrate, and a recessed part 51 is provided in a portion of the second substrate 50 to face the vibrating member 22. The joint member 40 is disposed on one surface 20a of the first substrate 20 in a frame shape so as to surround the vibrating member 22.

In the second substrate 50, upper electrodes 52 to 54 are disposed on a bottom surface of the recessed part 51 to face displaceable regions of the control electrodes 34a to 36a. Herein, the control electrodes 34a to 36a are, respectively, disposed on the front surfaces 24a to 26a of the first and second drive pieces 24 and 25, and the detection piece 26. As a result, first to third capacitances CV1 to CV3 are generated between the control electrodes 34a to 36a, and the upper electrodes 52 to 54, respectively.

The third substrate 70 is joined to the other surface 20b of the first substrate 20 through a joint member 60 made of an oxide film, a low dielectric glass, or metal. Similar to the second substrate 50, the third substrate 70 is provided by, for example, a silicon substrate, and a recessed part 71 is provided in a portion of the third substrate 70 to face the vibrating member 22. The joint member 60 is disposed on the other surface 20b of the first substrate 20 in a frame shape so as to surround the vibrating member 22 of the first substrate 20. In other words, the vibrating member 22 is hermetically sealed by an airtight chamber 80 defined by the second and third substrates 50, 70, and the joint members 40, 60. In the present embodiment, a pressure in the airtight chamber 80 is a vacuum pressure.

In the third substrate 70, lower electrodes 72 to 74 are disposed on a bottom surface of the recessed part 71 to face displaceable regions of the control electrodes 34b to 36b. Herein, the control electrodes 34b to 36b are, respectively, disposed on the respective rear surfaces 24b to 26b of the first and second drive pieces 24 and 25, and the detection piece 26. As a result, fourth to sixth capacitances CV4 to CV6 are generated between the control electrodes 34b to 36b, and the lower electrodes 72 to 74, respectively.

Although will be described in detail later, the portions facing the displaceable regions of the control electrodes 34a, 34b, 35a, 35b represent portions facing those displaceable regions even when the first and second drive pieces 24 and 25 vibrate in the x-axis direction. Likewise, the portions facing the control electrodes 36a and 36b represent portions facing those control electrodes 36a and 36b even when the detection piece 26 vibrates (is bent) in the x-axis direction upon receiving an angular velocity.

Although not particularly shown, the drive electrodes 31a, 31b, 32a, 32b, the detection electrodes 33a, 33b, the common electrodes 31c, 32c, 33c, 31d, 32d, 33d, and the control electrodes 34a, 35a, 36a, 34b, 35b, 36b are connected to a circuit unit 90 to be described later through wiring layers disposed on the first and second drive pieces 24, 25, the detection piece 26, and so on, respectively.

Figure 4:
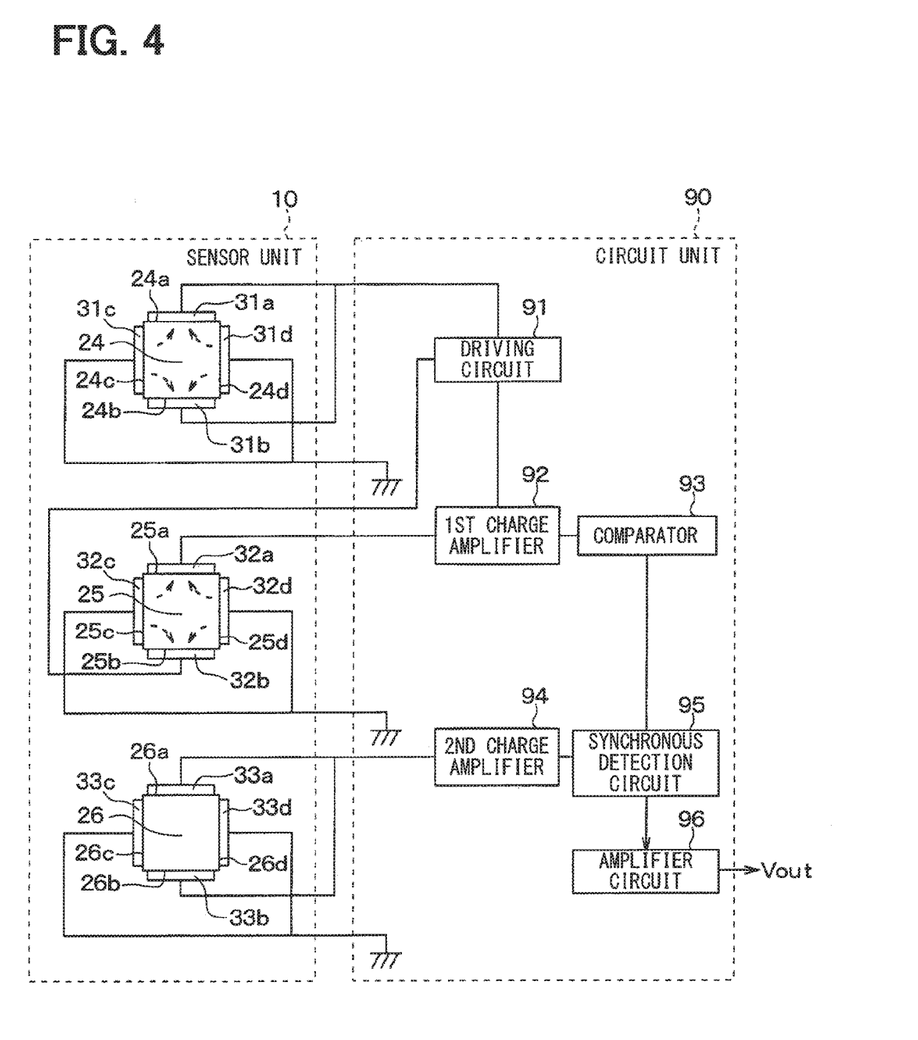
FIG. 4 is a diagram showing a circuit configuration of an angular velocity sensor according to a first embodiment of the present disclosure.

The sensor unit 10 according to the present embodiment is configured as described above. A circuit configuration of the angular velocity sensor will be described. As illustrated in FIG. 4, the circuit unit 90 includes a driving circuit 91, a first charge amplifier 92, a comparator 93, a second charge amplifier 94, a synchronous detection circuit 95, and an amplifier circuit 96.

The driving circuit 91 has an AGC (auto gain control) circuit, and is connected to the drive electrodes 31a and 31b of the first drive piece 24, and the drive electrode 32b of the second drive piece 25. The driving circuit 91 supplies, to the drive electrodes 31a, 31b, and 32b, a drive signal having a gain adjusted on the basis of a voltage signal input from the first charge amplifier 92. The pulsed drive signal (carrier) supplied to the drive electrodes 31a and 31b of the first drive piece 24 has predetermined amplitude and frequency. The drive signal (carrier) supplied to the drive electrode 32b of the second drive piece 25 is different in phase from the drive signal (carrier) supplied to the drive electrodes 31a and 31b by 180° in phase.

Figure 6A:
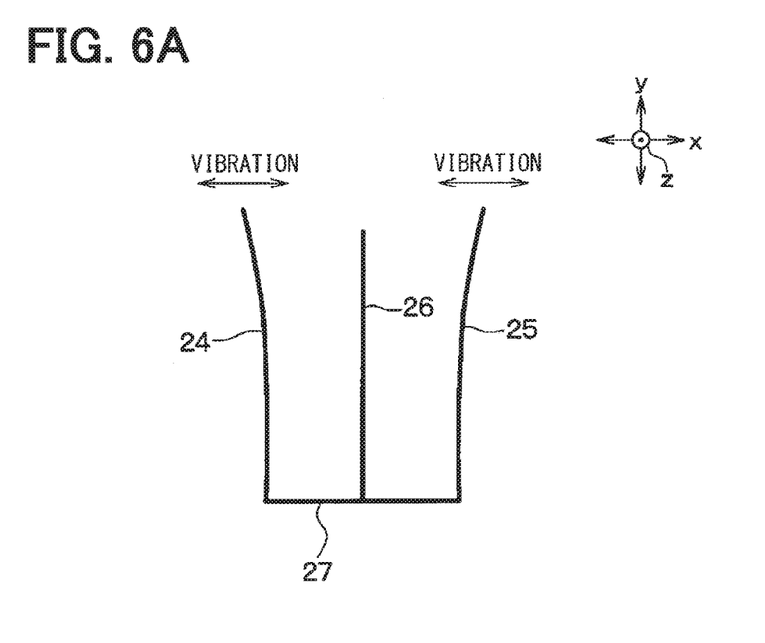
FIG. 6A is a diagram showing a state of first and second drive pieces and a detection piece when an angular velocity is not applied.

Now, the basic operation of the vibrating member 22 will be described in brief. When the drive signals (carriers) different in phase by 180° are supplied to the drive electrodes 31a, 31b, and 32b of the first and second drive pieces 24 and 25, electric fields in an opposite direction are generated in the first drive piece 24 and the second drive piece 25 as indicated by dashed arrows in FIG. 4. For example, in FIG. 4, when the side surface 24c of the first drive piece 24 is compressed, and the side surface 24d is expanded, the side surface 25c of the second drive piece 25 is expanded, and the side surface 25d is compressed. For that reason, the compression and the expansion are alternately successively repeated in the first and second drive pieces 24 and 25, to thereby vibrate the first and second drive pieces 24 and 25 in the x-axis direction as indicated in FIG. 6A.

In this state, because moments to be applied to the detection piece 26 from the first and second drive pieces 24 and 25 through the base portion 27 are opposite in direction to each other and canceled, the detection piece 26 maintains a substantially stationary state. In addition, with the vibration of the first and second drive pieces 24 and 25, electric charge is generated in the respective drive electrodes 31a, 31b, 32b, and the common electrodes 31c to 32d.

Figure 6B:
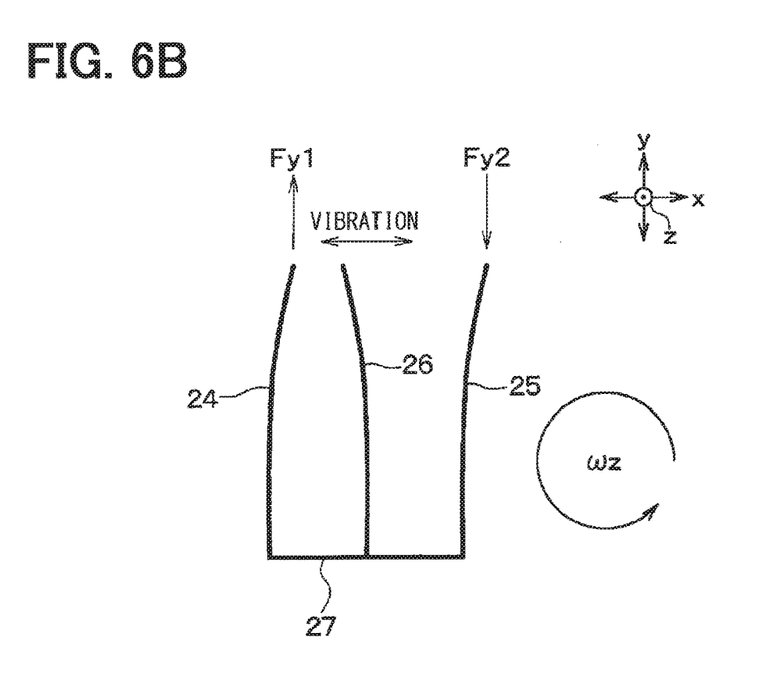
FIG. 6B is a diagram showing a state of the first and second drive pieces and the detection piece when an angular velocity ωz is applied.

When an angular velocity ωz is supplied to the plane of the first substrate 20, a pair of Coriolis forces Fy1 and Fy2 whose directions are opposite in the y direction are periodically generated in the first and second drive pieces 24 and 25 as illustrated in FIG. 6B. For that reason, the moments generated by the Coriolis forces are transmitted to the detection piece 26 through the base portion 27, to thereby vibrate (bend) the detection piece 26 in the x-axis direction. As a result, electric charge is generated in the detection electrodes 33a, 33b, and the common electrodes 33c, 33d. The basic operation of the vibrating member 22 has been described.

The first charge amplifier 92 is connected to the drive electrode 32a of the second drive piece 25, the driving circuit 91, and the comparator 93. The second drive piece 25 vibrates, to thereby convert the charge generated in the drive electrode 32a into a voltage signal and output the voltage signal to the driving circuit 91 and the comparator 93.

The comparator 93 is connected to the synchronous detection circuit 95, and generates a reference signal based on the drive signal from the voltage signal input from the first charge amplifier 92. The comparator 93 outputs the reference signal to the synchronous detection circuit 95.

The second charge amplifier 94 is connected to the detection electrodes 33a and 33b of the detection piece 26 and the synchronous detection circuit 95. The second charge amplifier 94 outputs, to the synchronous detection circuit 95, a sensor signal obtained by converting the electric charge generated in the detection electrodes 33a and 33b into voltage signal.

The synchronous detection circuit 95 is connected to the amplifier circuit 96. The synchronous detection circuit 95 synchronously detects the sensor signal input from the second charge amplifier 94 with the use of the reference signal input from the comparator 93, and outputs the sensor signal to the amplifier circuit 96.

The amplifier circuit 96 amplifies the sensor signal input from the synchronous detection circuit 95 by a predetermined multiplication factor, and outputs an amplified sensor signal Vout to an external circuit. As a result, an angular velocity is detected by the external circuit using the sensor signal Vout.

The potential of the common electrodes 31c to 33d disposed on the first and second drive pieces 24, 25, and the detection piece 26 is set to be equal to a ground potential (GND).

Figure 5:
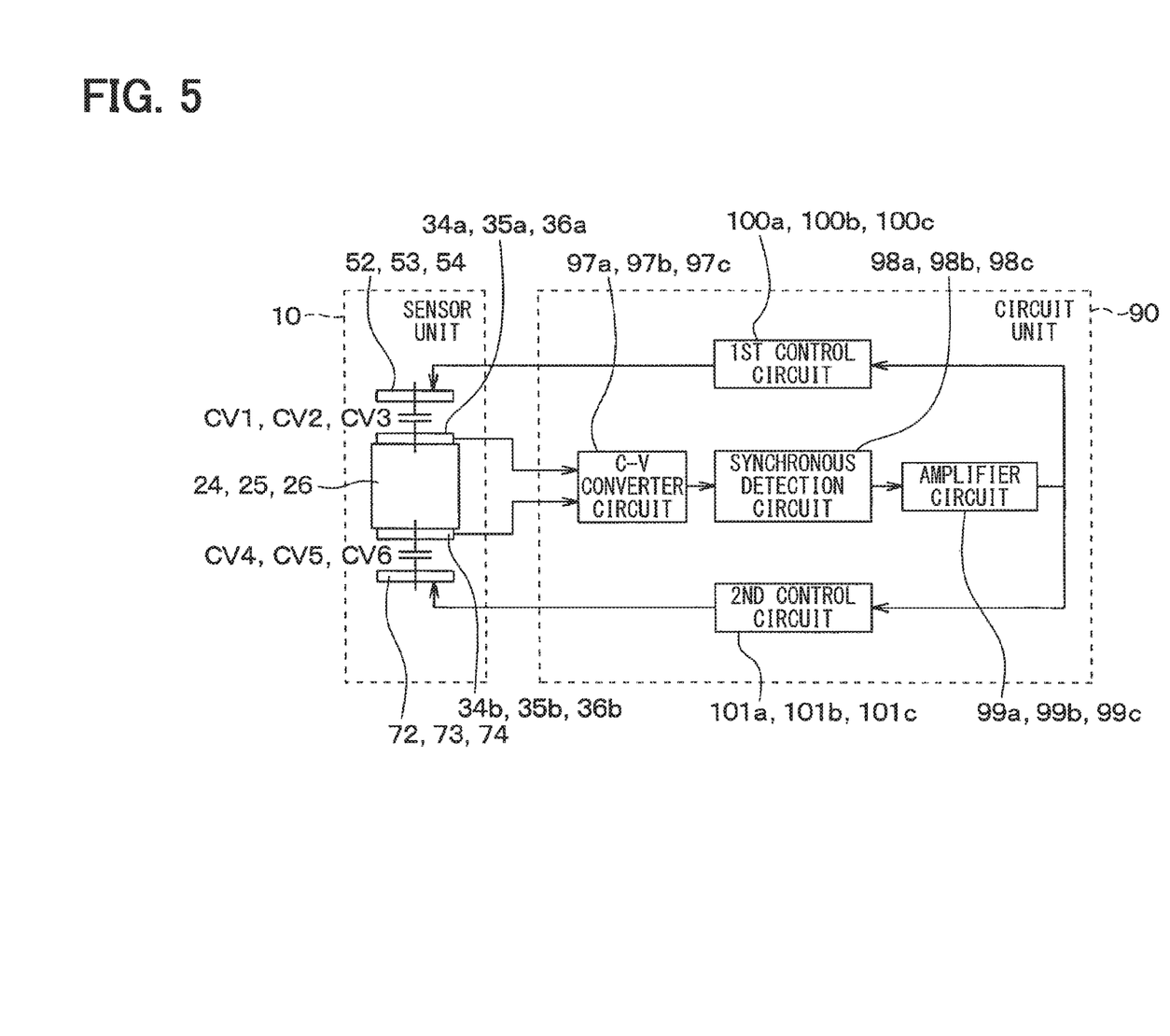
FIG. 5 is a diagram showing a circuit configuration of another portion different from that in FIG. 4.

As illustrated in FIG. 5, the circuit unit 90 further includes capacitance to voltage (C-V) converter circuits 97a, 97b, 97c, synchronous detection circuits 98a, 98b, 98c, amplifier circuits 99a, 99b, 99c, first control circuits 100a, 100b, 100c, and second control circuits 101a, 101b, 101c.

The C-V converter circuit 97a is connected to the synchronous detection circuit 98a, and converts a difference between the first capacitance CV1 generated between the control electrode 34a and the upper electrode 52 and the fourth capacitance CV4 generated between the control electrode 34b and the lower electrode 72 into a detection signal, that is the voltage signal, to output the detection signal to the synchronous detection circuit 98a.

Likewise, the C-V converter circuit 97b is connected to the synchronous detection circuit 98b, and converts a difference between the second capacitance CV2 generated between the control electrode 35a and the upper electrode 53 and the fifth capacitance CV5 generated between the control electrode 35b and the lower electrode 73 into the detection signal, that is the voltage signal, to output the detection signal to the synchronous detection circuit 98b.

The C-V converter circuit 97c is connected to the synchronous detection circuit 98c, and converts a difference between the third capacitance CV3 generated between the control electrode 36a and the upper electrode 54 and the sixth capacitance CV6 generated between the control electrode 36b and the lower electrode 74 into the detection signal, that is the voltage signal, to output the detection signal to the synchronous detection circuit 98c.

The synchronous detection circuits 98a to 98c are connected to the amplifier circuits 99a to 99c, respectively, and also connected to the comparator 93 as shown in FIG. 4. The synchronous detection circuits 98a to 98c synchronously detect the respective detection signals input from the C-V converter circuits 97a to 97c with the use of the reference signal input from the comparator 93, and output the detection signals to the amplifier circuits 99a to 99c, respectively.

The amplifier circuits 99a to 99c are connected to the first and second control circuits 100a to 101c, respectively, amplify the detection signals input from the synchronous detection circuits 98a to 98c by a predetermined multiplication factor, and output the amplified detection signals to the first and second control circuits 100a to 101c, respectively.

The first and second control circuits 100a and 101a determine a position of the first drive piece 24 on the basis of the detection signal input from the amplifier circuit 99a. The first control circuit 100a adjusts a voltage to be applied to the upper electrode 52 on the basis of the position of the first drive piece 24, and the second control circuit 101a adjusts a voltage to be applied to the lower electrode 72 on the basis of the position of the first drive piece 24, to thereby adjust the position of the first drive piece 24. In other words, the first and second control circuits 100a and 101a adjust an electrostatic force generated between the control electrode 34a and the upper electrode 52, and an electrostatic force generated between the control electrode 34b and the lower electrode 72, to thereby adjust the position of the first drive piece 24.

Likewise, the first and second control circuits 100b and 101b determine a position of the second drive piece 25 on the basis of the detection signal input from the amplifier circuit 99b. The first control circuit 100b adjusts a voltage to be applied to the upper electrode 53 on the basis of the position of the second drive piece 25, and the second control circuit 101b adjusts a voltage to be applied to the lower electrode 73 on the basis of the position of the second drive piece 25, to thereby adjust the position of the second drive piece 25. In other words, the first and second control circuits 100b and 101b adjust an electrostatic force generated between the control electrode 35a and the upper electrode 53, and an electrostatic force generated between the control electrode 35b and the lower electrode 73, to thereby adjust the position of the second drive piece 25.

The first and second control circuits 100c and 101c determine a position of the detection piece 26 on the basis of the detection signal input from the amplifier circuit 99c. The first control circuit 100c adjusts a voltage to be applied to the upper electrode 54 on the basis of the position of the detection piece 26, and the second control circuit 101c adjusts a voltage to be applied to the lower electrode 74 on the basis of the position of the detection piece 26, to thereby adjust the position of the detection piece 26. In other words, the first and second control circuits 100c and 101c adjust an electrostatic force generated between the control electrode 36a and the upper electrode 54, and an electrostatic force generated between the control electrode 36b and the lower electrode 74, to thereby adjust the position of the detection piece 26.

The configuration of the angular velocity sensor of the present embodiment is described above. In the present embodiment, each of the control electrodes 34a and 35a corresponds to a first drive piece control electrode, and the control electrode 36a corresponds to a first detection piece control electrode. Each of the control electrodes 34b and 35b corresponds to a second drive piece control electrode, and the control electrode 36b corresponds to a second detection piece control electrode. Each of the upper electrodes 52 and 53 corresponds to a first drive piece auxiliary electrode, and the upper electrode 54 corresponds to a first detection piece auxiliary electrode. Each of the lower electrodes 72 and 73 corresponds to a second drive piece auxiliary electrode, and the lower electrode 74 corresponds to a second detection piece auxiliary electrode. Further, each of the first control circuits 100a and 100b corresponds to a first drive piece control circuit, and the first control circuit 100c corresponds to a first detection piece control circuit. Each of the second control circuits 101a and 101b corresponds to a second drive piece control circuit, and the second control circuit 101c corresponds to a second detection piece control circuit. The following will describe the operation of the above angular velocity sensor.

As described above, when the drive signals (carriers) different in phase by 180° are supplied to the drive electrodes 31a and 31b of the first drive piece 24 and the drive electrode 32b of the second drive piece 25, the first and second drive pieces 24 and 25 vibrate in the x-axis direction, and the detection piece 26 maintains a substantially stationary state. When the angular velocity is applied to the plane of the first substrate 20 in that state, the angular velocity is detected on the basis of the electric charge generated in the detection electrodes 33a and 33b because the detection piece 26 vibrates in the x-axis direction according to the angular velocity.

Each of the first and second drive pieces 24 and 25, and the detection piece 26 has a rectangular-shaped cross-section. However, strictly, since connection portions of the front surfaces 24a to 26a with the side surfaces 24c to 26d are slightly rounded (have tapered shapes), and the rear surfaces 24b to 26b with the side surfaces 24c to 26d are slightly rounded (have tapered shapes), the first and second drive pieces 24, 25, and the detection piece 26 may be displaced in the z direction.

For that reason, the first and second control circuits 100a to 101c appropriately adjust the voltages to be applied to the upper electrodes 52 to 54 and the lower electrodes 72 to 74 so that the first and second drive pieces 24, 25, and the detection piece 26 are not displaced in the z direction, respectively.

Figure 7A:
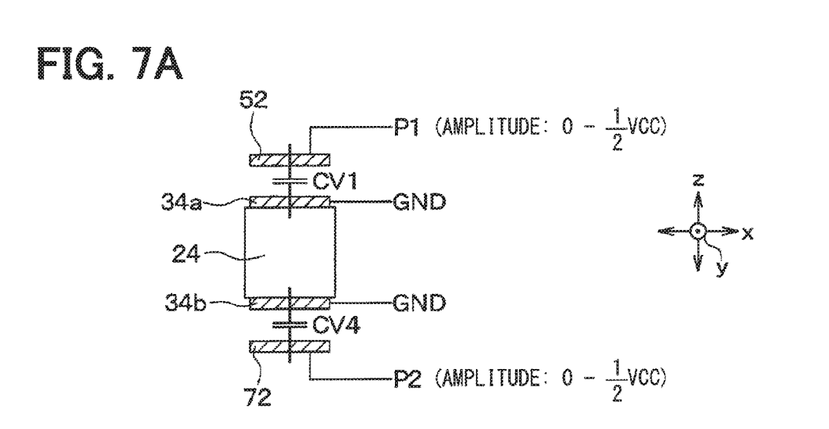
FIG. 7A is a diagram showing a voltage applied to a control electrode, an upper electrode, and a lower electrode when the first drive piece is not displaced in a z direction.

The first drive piece 24 will be described as an example. As illustrated in FIG. 7A, when detecting the angular velocity, a pulsed carrier (voltage) P1 that is 0 to ½ VCC in amplitude is input to the upper electrode 52 from the first control circuit 100a. A pulsed carrier (voltage) P2 that is 0 to ½ VCC in amplitude and different in phase from the carrier P1 by 180° is input to the lower electrode 72 from the second control circuit 101a.

The potential of the control electrodes 34a and 34b is set to be equal to the ground potential. For that reason, in this situation, a potential difference between the control electrode 34a and the upper electrode 52 is set to be equal to a potential difference between the control electrode 34b and the lower electrode 72.

Figure 7B:
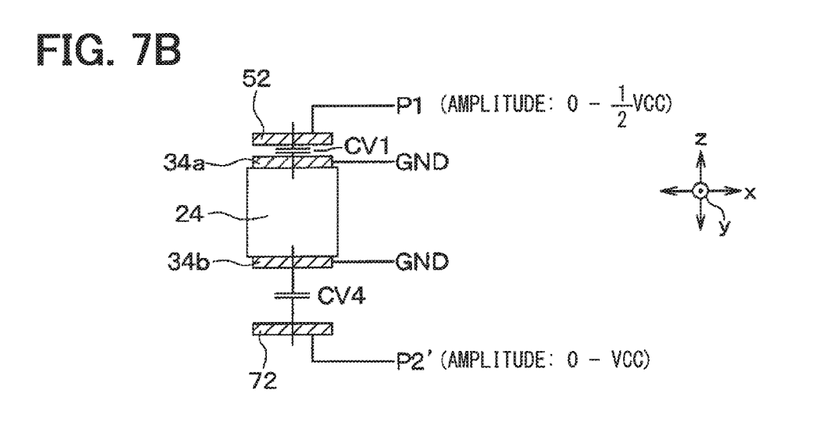
FIG. 7B is a diagram showing a voltage applied to the control electrode, the upper electrode, and the lower electrode when the first drive piece is displaced in a +z direction.

During vibration of the first drive piece 24, as illustrated in FIG. 7B, when the first drive piece 24 is displaced in the +z direction (toward upper electrode 52) (unnecessary vibration), the first and fourth capacitances CV1 and CV4 change. In that case, the first and second control circuits 100a and 101a first determine the position of the first drive piece 24 on the basis of the detection signal output from the C-V converter circuit 97a. Because the first drive piece 24 is displaced in the +z direction in FIG. 7B, the first control circuit 100a directly applies the carrier P1 to the upper electrode 52, and the second control circuit 101b applies a carrier (voltage) P2' that is 0 to VCC in amplitude to the lower electrode 72. In other words, because the first drive piece 24 is displaced in the +z direction to reduce the fourth capacitance CV4, the amplitude of the voltage to be applied to the lower electrode 72 generating the fourth capacitance CV4 is increased. As a result, an electrostatic force generated between the control electrode 34b and the lower electrode 72 becomes larger, and the first drive piece 24 is attracted in the −z direction (toward lower electrode 72). For that reason, the first drive piece 24 can be suppressed from being displaced in the +z direction. In other words, a distance between the control electrode 34a and the upper electrode 52, and a distance between the control electrode 34b and the lower electrode 72 can be kept constant. In other words, the distance between the control electrode 34a and the upper electrode 52 can be maintained at a predetermined distance. Likewise, the distance between the control electrode 34b and the lower electrode 72 can be maintained at a predetermined distance. Those two predetermined distances may be set to the same distance, or may be set to predetermined distances different from each other.

Figure 7C:
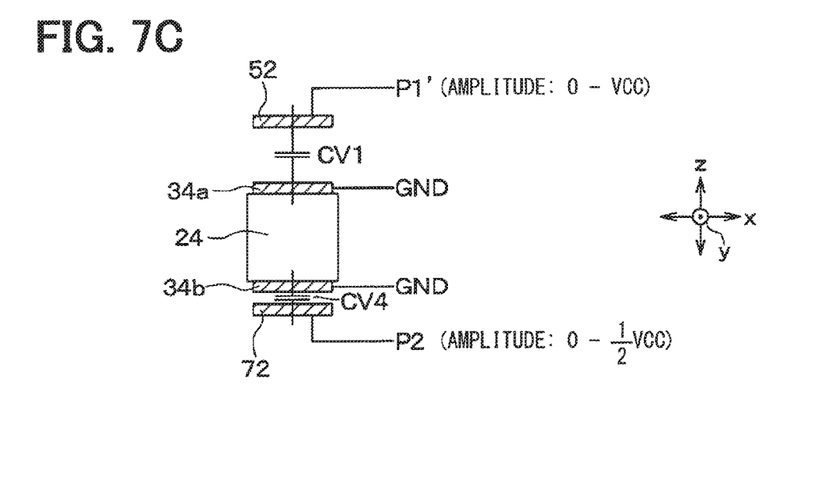
FIG. 7C is a schematic view showing a voltage applied to the control electrode, the upper electrode, and the lower electrode when the first drive piece is displaced in a −z direction.

As illustrated in FIG. 7C, even when the first drive piece 24 is displaced in the −z direction (toward lower electrode 72) (unnecessary vibration), the first and fourth capacitances CV1 and CV4 change. Similarly, in that case, the first and second control circuits 100b and 101b first determine the position of the first drive piece 24 on the basis of the detection signal output from the C-V converter circuit 97a. Because the first drive piece 24 is displaced in the −z direction in FIG. 7C, the first control circuit 100a applies the carrier (voltage) P1' that is 0 to VCC in amplitude to the upper electrode 52, and the second control circuit 101b applies the carrier P2 to the lower electrode 72 as it is. In other words, because the first drive piece 24 is displaced in the −z direction to reduce the first capacitance CV1, the amplitude of the voltage to be applied to the upper electrode 52 configuring the first capacitance CV1 is increased. As a result, an electrostatic force generated between the control electrode 34a and the upper electrode 52 becomes larger, and the first drive piece 24 is attracted in the +z direction (toward upper electrode 52). For that reason, the first drive piece 24 can be suppressed from being displaced in the −z direction. In other words, a distance between the control electrode 34a and the upper electrode 52, and a distance between the control electrode 34b and the lower electrode 72 can be kept constant.

In other words, in the present embodiment, the first control circuit 100a adjusts the electrostatic force between the control electrode 34a and the upper electrode 52 to prevent the first drive piece 24 from being displaced in the z direction, and the second control circuit 101a adjusts the electrostatic force between the control electrode 34b and the lower electrode 72 to prevent the first drive piece 24 from being displaced in the z direction.

In this example, the first drive piece 24 is described as an example, but the same as the first drive piece 24 is applied to the second drive piece 25 and the detection piece 26. In other words, the second drive piece 25 and the detection piece 26 are suppressed from being displaced in the z direction by appropriately adjusting the carrier (voltage) to be applied to the upper electrodes 53, 54, and the lower electrodes 73, 74 by the first and second control circuits 100b, 100c, 101b, and 101c. In other words, a distance between the control electrode 35a, 36a and the upper electrode 53, 54, and a distance between the control electrode 35b, 36b and the lower electrode 73, 74 are maintained constant.

As described above, in the present embodiment, the control electrodes 34a to 35b are disposed on the first and second drive pieces 24 and 25. The upper electrodes 52 and 53 providing the first and second capacitances CV1 and CV2 between the upper electrodes 52, 53 and the control electrodes 34a, 35a are disposed on the second substrate 50, and the lower electrodes 72 and 73 providing the fourth and fifth capacitances CV4 and CV5 between the lower electrodes 72, 73 and the control electrodes 34b, 35b are disposed on the third substrate 70.

The first and second control circuits 100a, 100b, 101a, and 101b adjust the carrier (voltage) to be applied to the upper electrodes 52, 53, and the lower electrodes 72, 73 on the basis of the first, second, fourth, and fifth capacitances CV1, CV2, CV4, and CV5 so that the distance between the control electrodes 34a, 35a and the upper electrodes 52, 53, and the distance between the control electrodes 34b, 35b and the lower electrodes 72, 73 are maintained constant. For that reason, the first and second drive pieces 24 and 25 can be suppressed from being displaced in the z direction, and the detection precision can be suppressed from being degraded.

Further, in the present embodiment, the control electrodes 36a and 36b are disposed on the detection piece 26. The upper electrode 54 providing the third capacitance CV3 between the upper electrode 54 and the control electrode 36a is disposed on the second substrate 50, and the sixth lower electrode 74 providing the sixth capacitance CV6 between the sixth lower electrode 74 and the control electrode 36b is disposed on the third substrate 70.

The first and second control circuits 100c and 101c adjust the carrier (voltage) to be applied to the upper electrode 54 and the lower electrode 74 on the basis of the third and sixth capacitances CV3 and CV6 so that the distance between the control electrode 36a and the upper electrode 54, and the distance between the control electrode 36b and the lower electrode 74 are maintained constant. For that reason, the detection piece 26 can be also suppressed from being displaced in the z direction, and the detection precision can be further suppressed from being degraded.

Second Embodiment

A second embodiment of the present disclosure will be described. In the present embodiment, the control electrodes 34b, 35b, 36b, and the lower electrodes 72, 73, 74 are not provided, and other configurations are similar to the configuration of the first embodiment, and therefore description of the similar part will be omitted.

Figure 8:
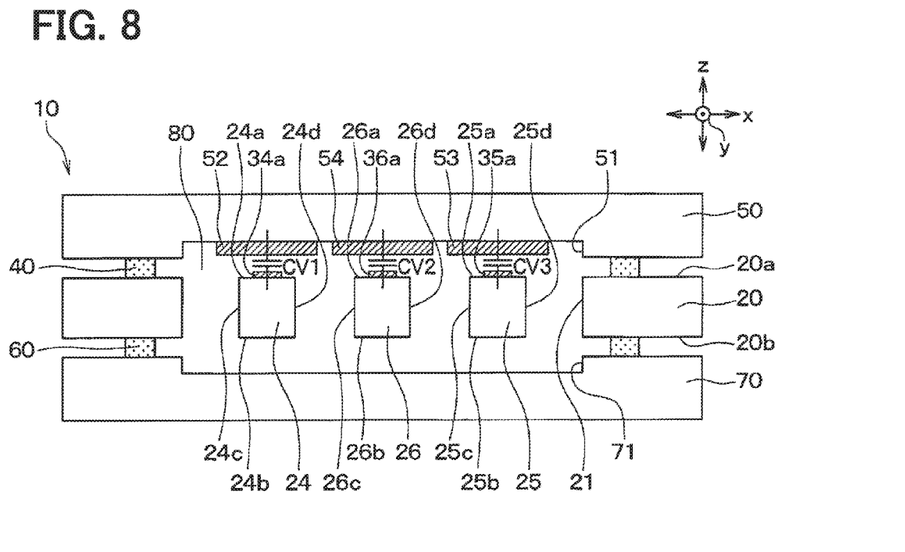
FIG. 8 is a diagram showing a cross-sectional view of a sensor unit according to a second embodiment of the present disclosure.

In the present embodiment, as illustrated in FIG. 8, control electrodes 34b, 35b, 36b are not provided to the first and second drive pieces 24 and 25, and the detection piece 26. Further, lower electrodes 72 to 74 are not provided to the third substrate 70.

Figure 9:
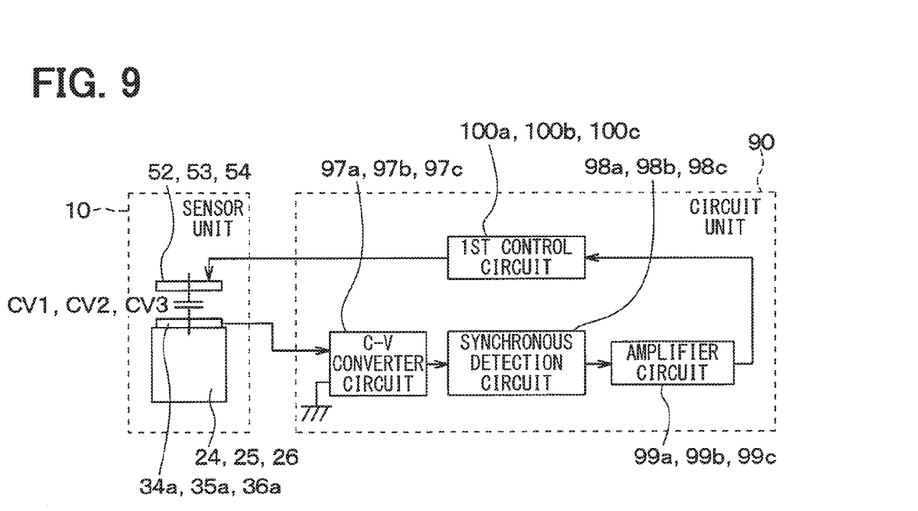
FIG. 9 is a diagram showing a circuit configuration of an angular velocity sensor according to the second embodiment of the present disclosure.

As illustrated in FIG. 9, a circuit unit 90 does not include second control circuits 101a to 101c, and a ground potential is input to C-V converter circuits 97a to 97c as a reference potential.

The following will describe the operation of the angular velocity sensor with the first drive piece 24 as an example.

Figure 10A:
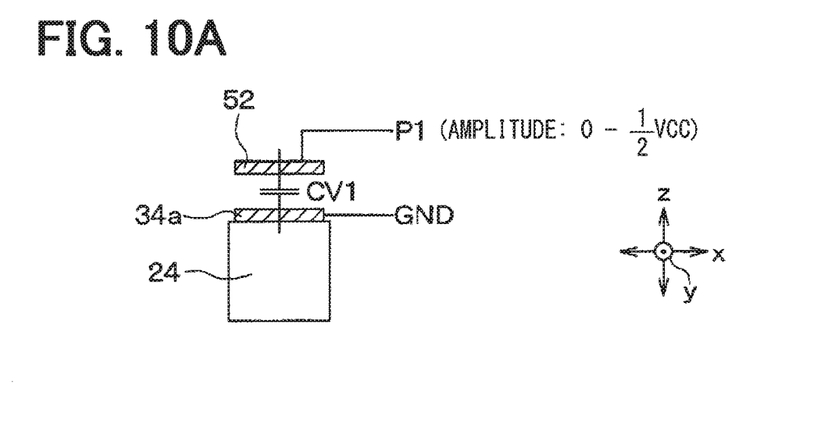
FIG. 10A is a diagram showing the voltage applied to the control electrode and the upper electrode when the first drive piece is not displaced in the z direction.

As illustrated in FIG. 10A, in the angular velocity sensor of this type, when detecting the angular velocity, a pulsed carrier (voltage) P1 that is 0 to ½ VCC in amplitude is input to the upper electrode 52 from the first control circuit 100a. The potential of the control electrode 34a is set to be equal to the ground potential. In other words, in the present embodiment, the angular velocity is detected in a state where the first drive piece 24 is attracted to the upper electrode 52 due to an electrostatic force between the control electrode 34a and the upper electrode 52 in advance.

Figure 10B:
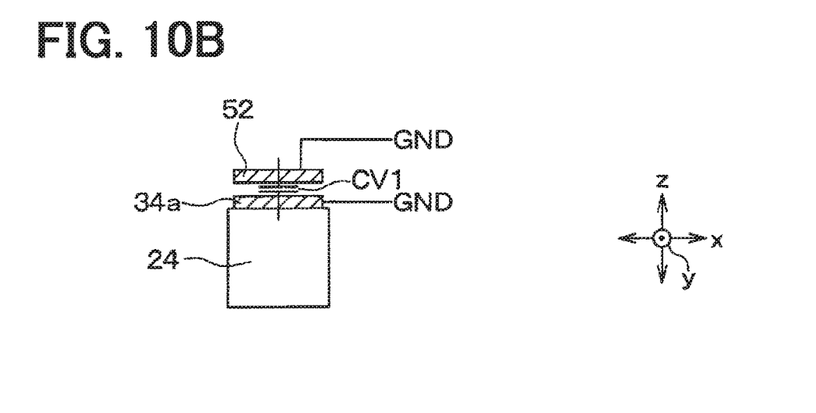
FIG. 10B is a diagram showing the voltage applied to the control electrode and the upper electrode when the first drive piece is displaced in the +z direction.

As illustrated in FIG. 10B, during vibration of the first drive piece 24, when the first drive piece 24 is displaced in the +z direction (toward upper electrode 52) (unnecessary vibration), the first capacitance CV1 changes. In that case, the first control circuit 100a determines the position of the first drive piece 24 on the basis of the detection signal output from the C-V converter circuit 97a. In FIG. 10B, because the first drive piece 24 is displaced in the +z direction, the first control circuit 100a applies the ground potential to the upper electrode 52. In other words, because the first drive piece 24 is displaced in the +z direction to increase the first capacitance CV1, the voltage to be applied to the upper electrode 52 is decreased. As a result, the electrostatic force generated between the control electrode 34a and the upper electrode 52 becomes smaller, and the first drive piece 24 attempts to return in the −z direction (toward third substrate 70). Therefore, the first drive piece 24 can be suppressed from being displaced in the +z direction (displaced from a state of FIG. 10A). In other words, a distance between the control electrode 34a and the upper electrode 52 can be maintained constant.

Figure 10C:
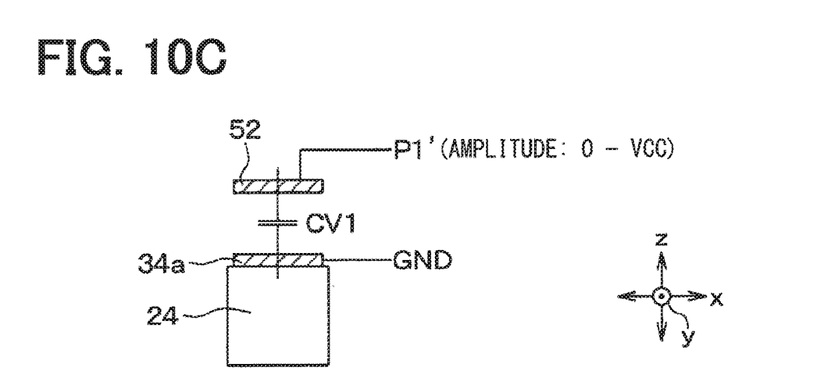
FIG. 10C is a diagram showing the voltage applied to the control electrode and the upper electrode when the first drive piece is displaced in the −z direction.

As illustrated in FIG. 10C, even when the first drive piece 24 is displaced in the −z direction (toward third substrate 70) (unnecessary vibration), the first capacitance CV1 changes. Similarly, in that case, the first control circuit 100a first determines the position of the first drive piece 24 on the basis of the detection signal output from the C-V converter circuit 97a. Because the first drive piece 24 is displaced in the −z direction in FIG. 10C, the first control circuit 100a applies the carrier (voltage) P1' that is 0 to VCC in amplitude to the upper electrode 52 as in FIG. 7C. In other words, because the first drive piece 24 is displaced in the −z direction to reduce the first capacitance CV1, the amplitude of the voltage to be applied to the upper electrode 52 configuring the first capacitance CV1 is increased. As a result, the electrostatic force generated between the control electrode 34a and the upper electrode 52 becomes larger, the first drive piece 24 is attracted in the +z direction (toward upper electrode 52), and the first drive piece 24 can be suppressed from being displaced in the −z direction (displaced from a state of FIG. 10A). In other words, a distance between the control electrode 34a and the upper electrode 52, and a distance between the control electrode 34b and the lower electrode 72 can be kept constant.

In this example, the first drive piece 24 is described as an example, but the same as the first drive piece 24 is applied to the second drive piece 25 and the detection piece 26. In other words, the second drive piece 25 and the detection piece 26 are suppressed from being displaced in the z direction by appropriately adjusting the carrier (voltage) to be applied to the upper electrodes 53 and 54 by the first control circuits 100b and 100c.

As described above, the same advantages as those in the first embodiment can be obtained even in the angular velocity sensor in which the lower electrodes 72 to 74 are not provided to the third substrate 70.

When the lower electrodes 72 to 74 are not provided as in the present embodiment, the third substrate 70 disposed close to another surface 20b of the first substrate 20 may be omitted.

Other Embodiments

The present disclosure is not limited to the embodiments described above and modifications can be appropriately performed within a scope of the appended claims.

For example, in the above first and second embodiments, the example in which the first and second drive pieces 24 and 25, and the detection piece 26 are projected from the base portion 27 in one direction has been described. Alternatively, the first and second drive pieces 24 and 25, and the detection piece 26 may be of a so-called T-type tuning-form type in which the respective pieces are projected from both sides of the base portion 27 in different directions.

In the above first and second embodiments, the second and third substrates 50 and 70 may be made of a piezoelectric material as with the first substrate 20.

In the first embodiment, for example, when the first drive piece 24 is displaced as illustrated in FIG. 7B, the first control circuit 100a may input a carrier (voltage) smaller in amplitude to the upper electrode 52. In other words, the electrostatic force between the control electrode 34a and the upper electrode 52 may be decreased. Likewise, when the first drive piece 24 is displaced as illustrated in FIG. 7C, the second control circuit 101a may input the carrier (voltage) smaller in amplitude to the lower electrode 72.

Further, in the above first and second embodiments, the control electrodes 36a and 36b may not be provided to the detection piece 26. Even in the angular velocity sensor of this type, because the first and second drive pieces 24 and 25 can be suppressed from being displaced in the z direction, the detection precision can be suppressed from being degraded.

In the above first and second embodiments, the example in which the present disclosure is applied to a so-called piezoelectric type angular velocity sensor has been described. Alternatively, for example, the present disclosure can be applied to a capacitive angular velocity sensor illustrated in FIG. 11.

In the capacitive angular velocity sensor, a vibrating member 22 includes a bar-shaped weight portion 113 supported to anchor portions 112 through respective drive beams 111. The weight portion 113 is provided with driving movable electrodes 114 and detection movable electrodes 115 which project in a direction perpendicular to a longitudinal direction (lateral direction of a paper surface in FIG. 11). A portion of each driving movable electrode 114 on the second substrate 50 side is provided with a control electrode 34a.

Figure 11:
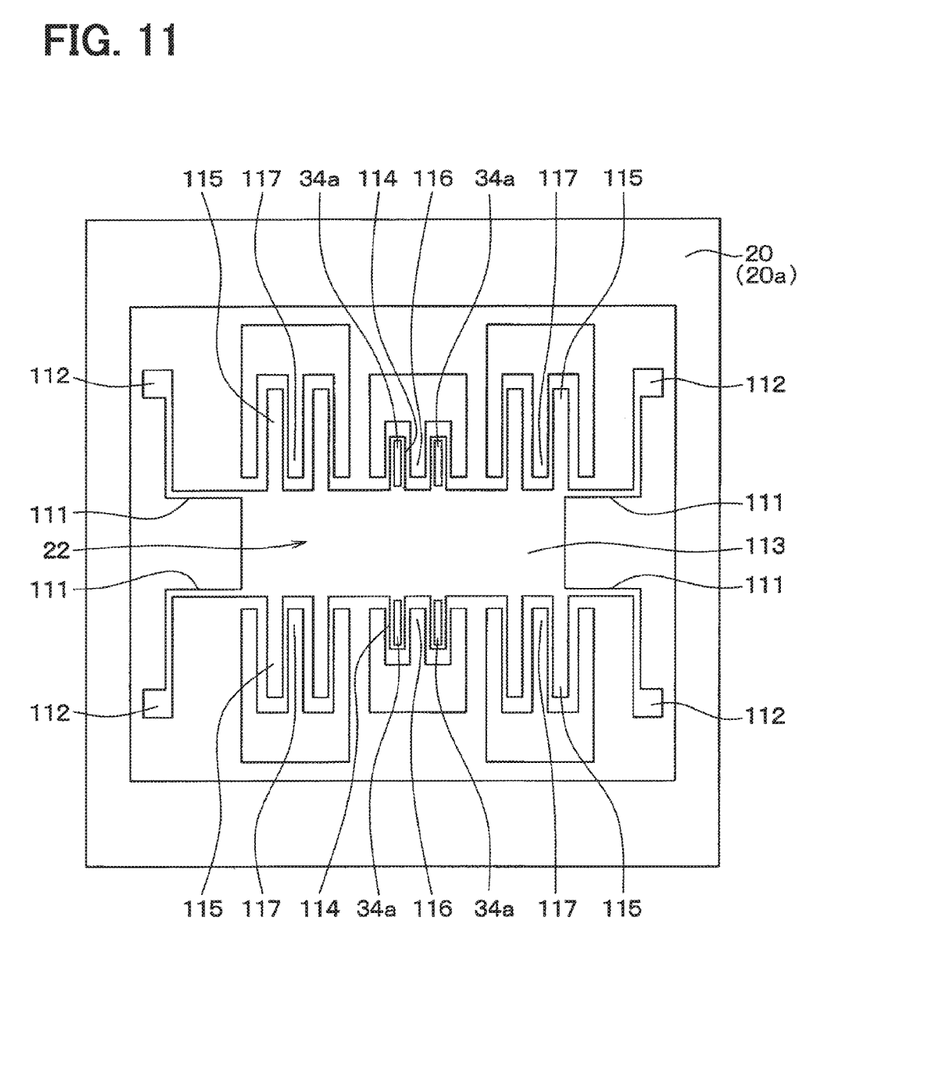
FIG. 11 is a diagram showing a top view of a first substrate according to another embodiment of the present disclosure.

The first substrate 20 includes a driving unit, which has driving fixed electrodes 116 each disposed to face the driving movable electrodes 114, and a detection unit, which has detection fixed electrodes 117 each disposed to face the detection movable electrodes 115.

In the angular velocity sensor of this type, the angular velocity is detected in a state where the vibrating member 22 is vibrated due to the electrostatic force generated between the driving movable electrodes 114 and the driving fixed electrodes 116. The vibrating member 22 may be displaced (unnecessarily vibrated) in a normal direction of the plane direction of the first substrate 20. For that reason, the upper electrode is disposed on a portion of the second substrate 50 facing the displaceable region of the control electrode 34a provided to each driving movable electrode 114, and as described above, the voltage to be applied to the upper electrode is appropriately adjusted whereby the advantages of the present disclosure can be obtained.

While the disclosure has been described with reference to preferred embodiments thereof, it is to be understood that the disclosure is not limited to the preferred embodiments and constructions. The disclosure is intended to cover various modification and equivalent arrangements. In addition, while the various combinations and configurations, which are preferred, other combinations and configurations, including more, less or only a single element, are also within the spirit and scope of the disclosure.

The invention claimed is:

1. An angular velocity sensor comprising:
   a first substrate including a first surface and a second surface, the second surface being disposed opposite to the first surface;
   a vibrating member disposed on the first substrate and including a drive piece, wherein the drive piece is capable of vibrating in a plane direction of the first substrate, and the vibrating member detects an angular velocity applied to a plane of the first substrate during a vibration of the drive piece;
   a second substrate disposed on a side of the first surface of the first substrate;
   a first drive piece control electrode disposed on a portion of the drive piece close to the second substrate;
   a first drive piece auxiliary electrode disposed on a portion of the second substrate facing a displaceable region of the first drive piece control electrode disposed on the drive piece, wherein a first auxiliary region of the first drive piece auxiliary electrode is disposed opposing an entire first control region of the displaceable region of the first drive piece control electrode, and wherein a capacitance is generated between the first drive piece auxiliary electrode and the first drive piece control electrode; and
   a first drive piece control circuit applying a voltage to the first drive piece auxiliary electrode,
   wherein the first drive piece control circuit adjusts, based on the capacitance generated between the first drive piece control electrode and the first drive piece auxiliary electrode, the voltage to be applied to the first drive piece auxiliary electrode so that a distance between the first drive piece control electrode and the first drive piece auxiliary electrode is maintained to be constant over the entire first control region of the displaceable region of the first drive piece control electrode.

2. The angular velocity sensor according to claim 1, further comprising:
   a third substrate disposed on a side of the second surface of the first substrate;
   a second drive piece control electrode disposed on a portion of the drive piece close to the third substrate;
   a second drive piece auxiliary electrode disposed on a portion of the third substrate facing the displaceable region of the second drive piece control electrode disposed on the drive piece, wherein a second auxiliary region of the second drive piece auxiliary electrode is disposed opposing an entire second control region of the displaceable region of the second drive piece control electrode, and wherein a capacitance is generated between the second drive piece auxiliary electrode and the second drive piece control electrode; and
   a second drive piece control circuit applying a voltage to the second drive piece auxiliary electrode,
   wherein the second drive piece control circuit adjusts, based on the capacitance generated between the second drive piece control electrode and the second drive piece auxiliary electrode, the voltage to be applied to the second drive piece auxiliary electrode so that a distance between the second drive piece control electrode and the second drive piece auxiliary electrode is maintained to be constant over the entire second control region of the displaceable region of the second drive piece control electrode.

3. The angular velocity sensor according to claim 1, wherein
the drive piece is referred to as a first drive piece,
the vibrating member further includes:
a second drive piece;
a detection piece disposed between the first drive piece and the second drive piece; and
a base portion holding the first drive piece, the second drive piece, and the detection piece,
the angular velocity sensor further comprises:
a first detection piece control electrode disposed on a portion of the detection piece close to the second substrate;
a first detection piece auxiliary electrode disposed on a portion of the second substrate facing a displaceable region of the first detection piece control electrode disposed on the detection piece and wherein a first auxiliary region of the first detection piece auxiliary electrode is disposed opposing an entire first control region of the displaceable region of the first detection piece control electrode, and wherein a capacitance is generated between the first detection piece auxiliary electrode and the first detection piece control electrode; and
a first detection piece control circuit applying a voltage to the first detection piece auxiliary electrode, and
the first detection piece control circuit adjusts, based on the capacitance generated between the first detection piece control electrode and the first detection piece auxiliary electrode, the voltage to be applied to the first detection piece auxiliary electrode so that a distance between the first detection piece control electrode and the first detection piece auxiliary electrode is maintained to be constant over the entire first control region of the displaceable region of the first detection piece control electrode.

4. The angular velocity sensor according to claim 2, wherein
the drive piece is referred to as a first drive piece,
the vibrating member further includes:
a second drive piece;
a detection piece disposed between the first drive piece and the second drive piece; and
a base portion holding the first drive piece, the second drive piece, and the detection piece,
the angular velocity sensor further comprises:
a first detection piece control electrode disposed on a portion of the detection piece close to the second substrate;
a second detection piece control electrode disposed on a portion of the detection piece close to the third substrate;
a first detection piece auxiliary electrode disposed on a portion of the second substrate facing a displaceable region of the first detection piece control electrode disposed on the detection piece and wherein a first auxiliary region of the first detection piece auxiliary electrode is disposed opposing an entire first control region of the displaceable region of the first detection piece control electrode, and wherein a first capacitance is generated between the first detection piece auxiliary electrode and the first detection piece control electrode;
a second detection piece auxiliary electrode disposed on a portion of the third substrate facing the displaceable region of the second detection piece control electrode disposed on the detection piece and wherein a second auxiliary region of the second detection piece auxiliary electrode is disposed opposing an entire second control region of the displaceable region of the second detection piece control electrode, and wherein a second capacitance is generated between the second detection piece auxiliary electrode and the second detection piece control electrode;
a first detection piece control circuit applying a voltage to the first detection piece auxiliary electrode; and
a second detection piece control circuit applying a voltage to the second detection piece auxiliary electrode,
the first detection piece control circuit adjusts, based on the capacitance generated between the first detection piece control electrode and the first detection piece auxiliary electrode, the voltage to be applied to the first detection piece auxiliary electrode so that a distance between the first detection piece control electrode and the first detection piece auxiliary electrode is maintained to be constant over the entire first control region of the displaceable region of the first detection piece control electrode, and
the second detection piece control circuit adjusts, based on the capacitance generated between the second detection piece control electrode and the second detection piece auxiliary electrode, the voltage to be applied to the second detection piece auxiliary electrode so that a distance between the second detection piece control electrode and the second detection piece auxiliary electrode is maintained to be constant over the entire second control region of the displaceable region of the second detection piece control electrode.

5. The angular velocity sensor according to claim 1, wherein
the vibrating member further includes:
a driving movable electrode as the drive piece; and
a detection movable electrode, and
the first substrate further includes:
a driving fixed electrode disposed on the first substrate to face the driving movable electrode, and an electrostatic force is generated between the driving fixed electrode and the driving movable electrode to vibrate the vibrating member; and
a detection fixed electrode disposed on the first substrate to face the detection movable electrode.

* * * * *